United States Patent [19]

Misic et al.

[11] Patent Number: 4,764,726

[45] Date of Patent: Aug. 16, 1988

[54] LOW DISTORTION RF SWITCHING CIRCUIT WITHOUT DC BIAS

[75] Inventors: George J. Misic, Novelty; Paul T. Orlando, Euclid, both of Ohio

[73] Assignee: Picker International, Inc., Highland Hts., Ohio

[21] Appl. No.: 903,983

[22] Filed: Sep. 5, 1986

Related U.S. Application Data

[63] Continuation-in-part of Ser. No. 762,306, Aug. 5, 1985.

[51] Int. Cl.$^4$ ............................................. G01R 33/20
[52] U.S. Cl. ..................................... 324/322; 324/311; 455/82; 455/83
[58] Field of Search ............... 324/300, 307, 318, 322, 324/309, 311; 455/82, 83, 84

[56] References Cited

U.S. PATENT DOCUMENTS

| | | | |
|---|---|---|---|
| 2,962,584 | 11/1960 | Lackoff | 455/82 |
| 3,039,048 | 6/1962 | Shoolery | 324/0.5 |
| 3,452,299 | 6/1969 | Angel | 455/83 |
| 4,075,552 | 2/1978 | Traficante et al. | 324/322 |
| 4,408,162 | 10/1983 | Egger | 324/318 |
| 4,452,250 | 6/1984 | Chance et al. | 128/653 |
| 4,467,282 | 8/1984 | Siebold | 324/309 |
| 4,558,425 | 12/1985 | Yamamoto | 364/555 |

OTHER PUBLICATIONS

Kan, S. et al., "A Versatile and Inexpensive Electronic System for a High Resolution NMR Spectrometer", Review of Scientific Instruments, vol. 44, No. 12, Dec. 1973.
"Quadrature Detection Coils-A Further $\sqrt{2}$ Improvement in Sensitivity", by Chen, Hoult & Sank; J. of Mag. Res. 54, pp. 324–327 (1983).

Primary Examiner—Jerry W. Myracle
Assistant Examiner—Kevin D. O'Shea
Attorney, Agent, or Firm—Fay, Sharpe, Beall, Fagan, Minnich & McKee

[57] ABSTRACT

During a transmit cycle portion, a radio frequency transmitter (C) continuously generates an AC biasing signal and selectively generates a radio frequency signal. The AC biasing signal gates a first switch (10) and a second switch (32) such that the radio frequency signals from the transmitter are conducted to a magnetic resonance probe (E) but are blocked from being conducted to a receiver (F). A first filter (20) prevents the bias signals from being applied to the probe. The second switch includes a pair of crossed diodes (34, 36) which are gated conductive by the AC bias signal. A filter (72) passes the radio frequency signals but not the bias signals to ground to prevent the radio frequency signals from reaching the receiver. A filter (80) allows the bias signals to be applied across a load (88) such that the transmitter sees the load at the bias signal frequency. Another filter (40) prevents the bias signal from reaching the transmitter. An additional switch (50) provides further isolation between the receiver and the transmitter during the transmit cycle portion. During the receive cycle portion, radio frequency signals received by the probe pass through the filters (20,40) directly to the receiver but are blocked by switch (10) from passing to the transmitter.

27 Claims, 3 Drawing Sheets

LOW DISTORTION RF SWITCHING CIRCUIT WITHOUT DC BIAS

This application is a continuation-in-part of U.S. application Ser. No. 762,306, filed Aug. 5, 1985 (now abandoned).

BACKGROUND OF THE INVENTION

The present invention relates to the art of radio frequency interface circuits. The invention finds particular application in interfacing between the transmission and reception of magnetic resonance spectroscopy probe signals and will be described with particular reference thereto. It is to be appreciated, however, that the present invention will find further application in other fields in which radio frequency signals are alternately transmitted and received including magnetic resonance imaging, magnetic resonance spectroscopic chemical or physical analysis, ultrasonics, radar, communications, and the like.

Heretofore, magnetic resonance spectrometers have commonly used linear polarization and crossed coils for simplicity of design. Single coil probes or antennas, which are used for both transmission and reception, require an interface circuit to connect the probe or NMR coil system to the transmitter during the transmit cycle and a receiver or preamplifier during the receive cycle. The interface circuits commonly included appropriate circuitry for isolating the transmitter and receiver at least during the transmission mode.

In the parent application hereto, a DC bias was applied to the interface circuit to effect switching between transmit and receive modes of operation. Although advantageous in many respects, the DC bias switching does have certain drawbacks. In particular, an external DC bias supply must be provided along with the associated components and circuitry to apply, isolate, and decouple the DC bias and the RF signal path. Moreover, precise timing is required to prevent the bias switching from occuring at an inappropriate time in the transmit/receive cycle. For example, if the DC bias was not applied to switch the interface circuit to the transmit mode before the application of RF power, RF power might be applied to the receiver. Additionally, the wave front from the DC switching or bias voltage may cause various undesirable transient effects, such as a broadband energy spike at the probe and preamplifier ports.

Other interface circuits have been switched between the transmit and receive modes with crossed pairs of diodes by utilizing the RF signal itself to bias the diodes between on and off states. Under the high energy levels of the transmit mode, the diodes were biased conductive; whereas under the lower energy of the receive mode, the diodes appeared as open circuits. Although the crossed diode switch designs eliminated the DC bias and the attendant bias control and interface circuitry, significant distortion of the RF wave form occured, generally known as crossover distortion. This distortion effect has been attributed to the intrinsic forward voltage drop of semi-conductor diodes typically about 0.7 volts for small signal types. Severity of the signal clipping generally exceeds the expected 1.4 volt peak-to-peak value because the RF power source did not see a proper load until the diodes were in the conducting state. In some instances, the available voltage output of the driving amplifier was greatly reduced until the diodes began to conduct, which clipped a substantial portion of the center of the RF wave form. In addition to the significant distortion, total elimination of signals at the lower end of the system's dynamic range resulted. For example, in NMR imaging and spectroscopy, the RF signals may have a wide dynamic range. Any distortion or clipping of the low level portions of the wave forms adversely impacted the quality of the results.

The present invention provides a new and improved interface which eliminates the above referenced problems and others to achieve improved switching of radio frequency signals.

SUMMARY OF THE INVENTION

In accordance with one aspect of the present invention, a radio frequency switching and interface circuit is provided. A radio frequency source supplies both a radio frequency signal and an AC bias signal of different frequencies. A first isolation means which is biased conductive by the AC bias signal is operatively connected with the RF source such that RF and bias signals are both transmitted therethrough when the RF source is on. However, when the RF source is off and no bias signal is being generated, RF signals are blocked from passing through the isolation means. A filter means, which passes the RF signals but not the bias signal, is operatively connected between the first isolation means and an antenna port. In this manner, when the RF source is on, the bias signals are blocked from reaching the antenna port, but the RF signals are transmitted thereto. When the RF source is off, RF signals received from the antenna port can pass through the filter means but are blocked by the isolation means from reaching the RF source. A receiver port is operatively connected with the filter means for receiving RF signals originating at the antenna port.

In accordance with the more limited aspects of the invention, additional filter and isolation means are provided between the preamplifier port and the remainder of the circuit in such a manner that the preamplifier port is effectively disconnected from the circuit in the transmit mode and effectively short circuited to the antenna probe during the receive portion of the cycle.

In accordance with yet a more limited aspect of the invention, a magnetic resonance imaging apparatus is provided for reconstructing man-readable images of an internal region of a sample. The imaging apparatus includes a probe for transmitting radio frequency excitation pulses into the sample and for receiving radio frequency resonance signals from the sample. The above discussed switching and interface circuit is connected between the radio frequency transmitter, which generates the resonance excitation pulses, inversion pulses, and other resonance control signals and the probe. The receiver port is interconnected with image reconstruction means for reconstructing a man-readable image for display on a video monitor or other display means.

In accordance with yet another aspect of the present invention, a method of interfacing a transmitter, a receiver, and a common antenna port are provided. The transmitter transmits both a radio frequency signal and an AC bias signal of a different frequency. The bias signal enables the passage of both RF and bias signals in the presence thereof. The bias signal is then filtered such that only the RF signal passes to an antenna probe. At least one of the radio frequency and bias signals from the transmitter further cause an isolation means disposed between the transmitter and a receiver port to assume an effective open circuit. After the transmission portion of the cycle, radio frequency signals received at the antenna port are blocked from passing to the transmitter and permitted to pass to the receiver.

A first advantage of the present invention is that it eliminates wave form distortion and harmonic generation.

Another advantage of the present invention is that it simplifies the switching circuitry and eliminates DC bias control systems.

Yet another advantage of the present invention resides in the high reliability of the switching function and its timing.

Still further advantages of the present invention will become apparent to those of ordinary skill in the art upon reading and understanding the following detailed description of the preferred embodiment.

BRIEF DESCRIPTION OF THE DRAWINGS

The invention may take form in various parts and arrangements of parts and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
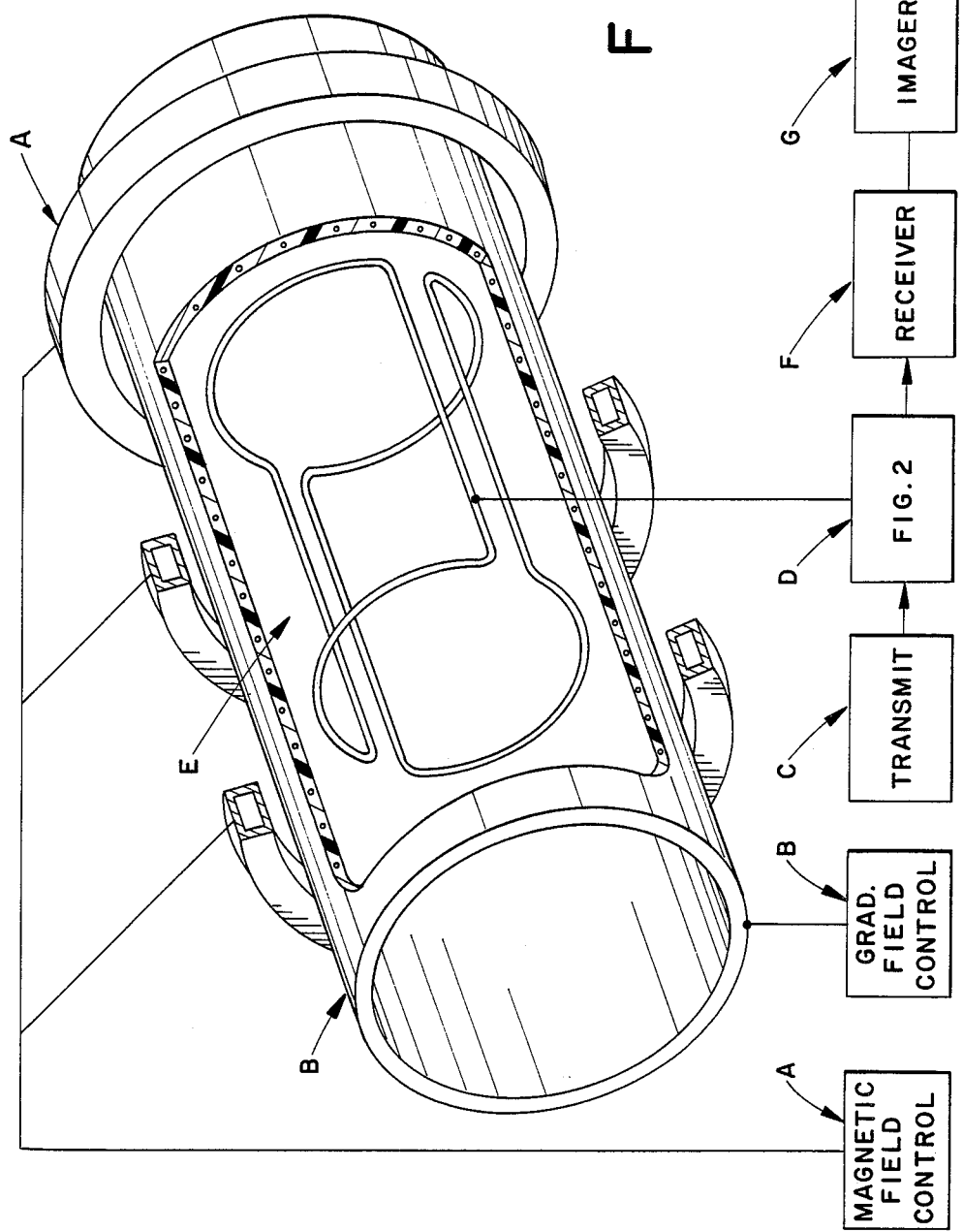
FIG. 1 is a diagrammatical illustration of a magnetic resonance imaging apparatus in accordance with the present invention.

With reference to FIG. 1, a magnetic resonance imaging apparatus includes a plurality of superconducting magnets A or other equivalent means for generating a strong magnetic field in an image region. A gradient coil means B selectively causes magnetic field gradients across the main magnetic field for selectively providing position and phase encoding. A magnetic resonance excitation transmitter, particularly an RF supply means C, selectively transmits both an AC bias signal and a radio frequency signal during a transmit portion of each transmit/receive cycle. The magnetic resonance exciting signals are transmitted through an interface circuit D to a probe or antenna E. During a receive portion of each transmit/receive cycle, the probe E receives magnetic resonance signals from the sample in the image region. The interface circuit D, which blocked the passage of RF signals to the receiver during the transmit cycle portion, passes the RF signals received by the receiver F during the receive cycle portion. An imager G, such as a two-dimensional Fourier transform imaging means, reconstructs electronic data representative of man-readable displays from the received radio frequency signals. Typically, the images are representative of density, position, relaxation time, and other characteristics of resonating nuclei in the imaging region. A video monitor or other display means H displays images which are a composite of received resonance data.

Figure 2:
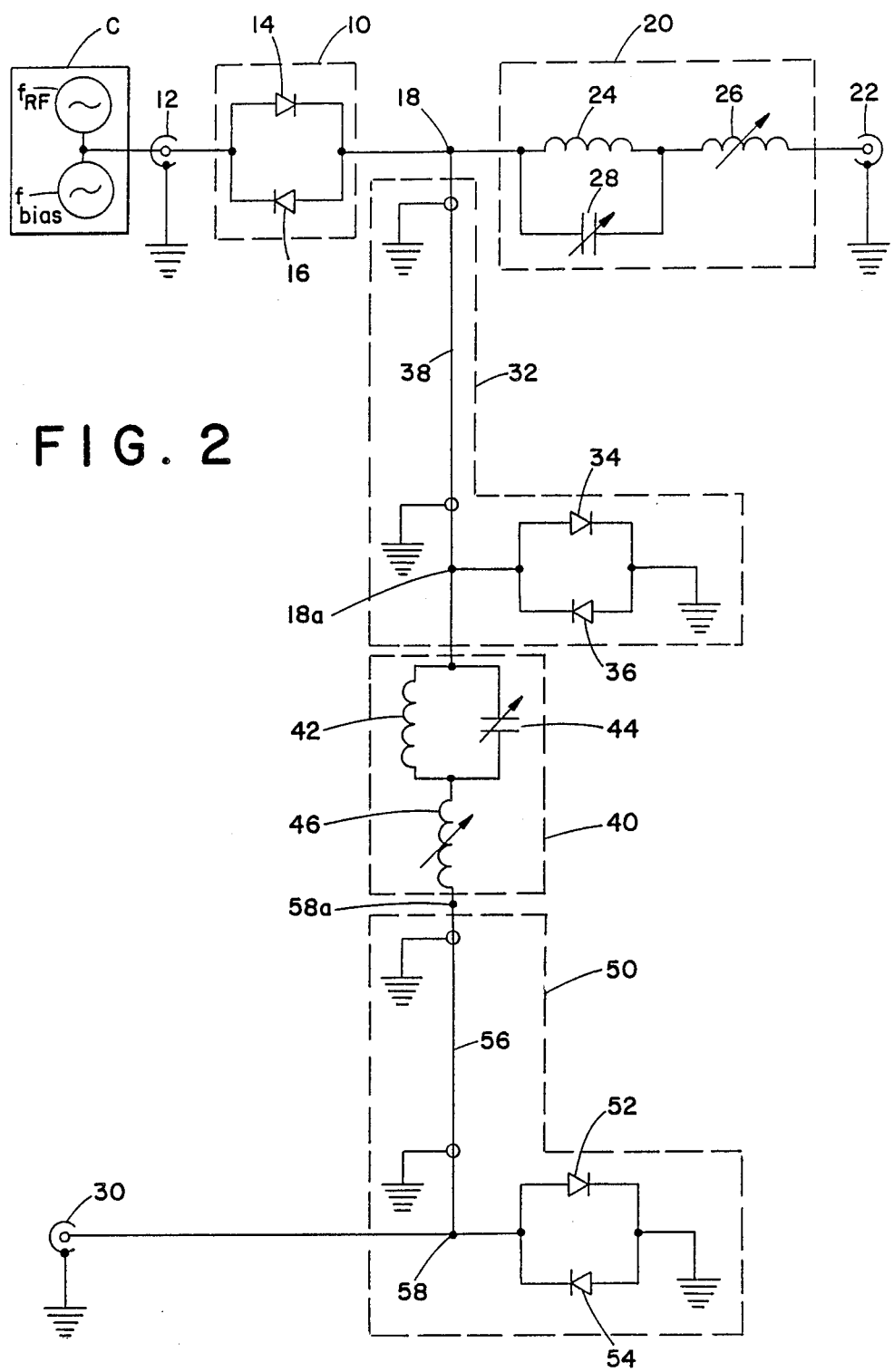
FIG. 2 is a circuit diagram of an interface circuit in accordance with the present invention; and, FIG. 3 illustrates an alternate embodiment of the interface circuit of FIG. 2.

With reference to FIG. 2, the radio frequency supply means C continuously generates a relatively low level AC bias signal during the transmit portion of each transmit/receive cycle. Further, the RF transmitter generates frequency signals, such as resonance excitation signals, inversion signals, and the like at appropriate times during the transmit cycle portion. The RF and AC bias signals are at different frequencies or otherwise encoded for ready separation.

The interface means D includes a first RF switch or isolation means 10 for selectively passing and blocking the passage of radio frequency signals from and to a transmitter port 12 to which the RF signal transmitter means C is connected. In the preferred embodiment, the first isolation means includes a pair of crossed PIN diodes 14, 16 which are configured to function as a switch means. The PIN diode pair switch means is rendered conductive in the presence of the AC biasing signal. If the PIN diodes break down at 0.7 volts, an AC bias signal with a peak-to-peak voltage of about 1.4 volts can be utilized to break down the diodes and maintain them conductive. In this manner, the first pair of PIN diodes appear as a short circuit between the transmitter port 12 and a junction or mode 18 whenever the transmitter is on, i.e. in the transmit cycle portion. However, when the transmitter is off, the crossed PIN diodes appear as an open circuit.

A first filter means 20 selectively passes the radio frequency signals and blocks the bias signals. That is, the filter means appears as a short circuit to radio frequency signals and as an open circuit to signals of the biasing signal frequency. The first filter means is connected between the junction 18, hence the first isolation or switch means 10, and an antenna or probe port 22. In this manner, radio frequency signals pass freely from the transmitter to the antenna port and from the antenna port through the first filter to the junction 18. However, bias signals are blocked from reaching the antenna port. In the preferred embodiment, the first filter means includes inductors 24, 26, and a capacitor 28 arranged as a series resonant network at the signal frequency and a parallel resonant circuit at the bias frequency. Preferably, at least one of the inductors and the capacitor are adjustable for selectively adjusting the frequencies which are passed and blocked by the first filter means.

A receiver port 30 is interconnected with the receiver means F and with the junction 18 to enable radio frequency signals from the antenna port to pass thereto. A second isolation or switching means 32 blocks the passage of radio frequency and other signals to the receiver port 30 during the transmit cycle portion and passes radio frequency signals during the receive portion. In the preferred embodiment, the second isolation means 32 includes a second pair of PIN diodes 34, 36 which are configured to function as a switch means. The second PIN diode pair switch means is rendered conductive by signals which are higher than the amplitude of signals normally received from the antenna port 22. That is, PIN diodes are selected which have a breakdown voltage greater than the peak amplitude of the anticipated radio frequency signals from the antenna port and less than the peak amplitude of the bias or radio frequency signals from the radio frequency supply means C. The bias signal renders the second crossed PIN diode pair 34, 36 conductive creating an effective short circuit. When the second crossed PIN diode pair is rendered conductive, a quarter wave length cable 38 inverts the low impedance at the junction 18a to a very high impedance at junction 18 at the radio frequency, isolating the receiver port 30 from the remainder of the interface circuit. During the receive cycle portion, the second PIN diode pair switch is not rendered conductive and appears as an open circuit which allows received radio frequency signals to pass through the quarter wave cable 38 to the receiver port 30.

A second filter means 40 is interconnected between the second isolation or switching means 32 and the receiver port 30 to prevent the biasing signal from being passed thereto. In the preferred embodiment, the second filter means includes inductors 42, 44 and a capacitor 46. The inductors and capacitors are selected such that the network is series resonant at the radio frequency and parallel resonant at the bias frequency. Again, at least one of the capacitor and inductors is adjustable for selecting the frequencies which are passed and blocked thereby.

A third isolation or switching means 50 provides additional isolation between the transmitter and the receiver. In the preferred embodiment, a third cross diode pair 52, 54 are forced into conduction by any residual high level radio frequency signals from the transmitter that passes the second isolation means 32. When the third cross diode pair switch becomes conductive, a quarter wave length cable 56 inverts the low impedance at a junction 58 to a very high impedance at 58a, thus improving the isolation. During the receive mode, the residual radio frequency signal levels are sufficiently low that the third cross diode pair switch appears as an open circuit and no isolation is provided enabling the radio frequency signals received at the antenna port 22 to pass to the receiver.

Figure 3:
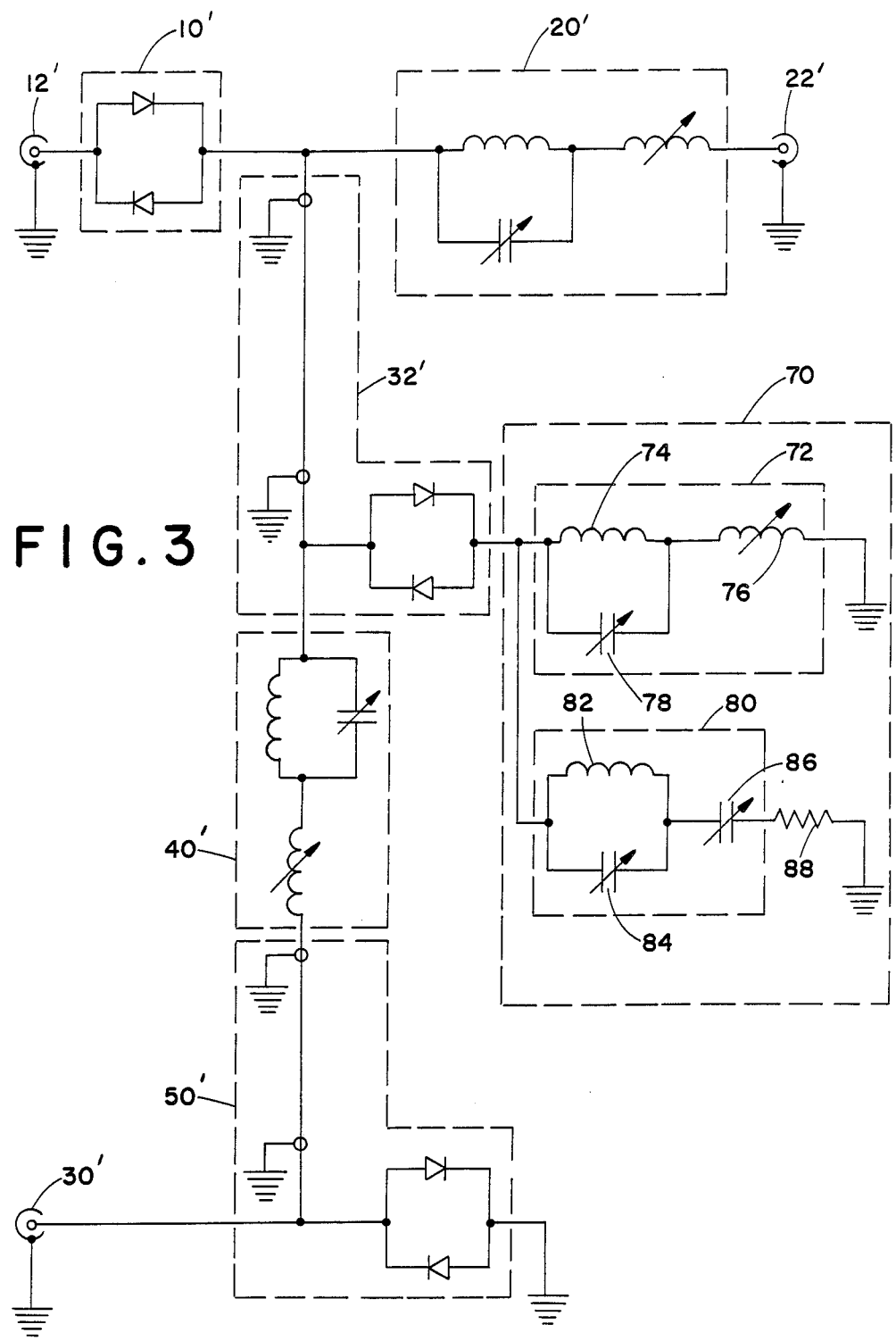

FIG. 3 illustrates an alternate embodiment of the switching and interface circuit of FIG. 2 in which a preselected load is presented to the transmitter during the transmit portion of each cycle. In FIG. 3 like elements with the embodiment of FIG. 2 are denoted by the same reference numeral but followed by a prime ('). A load circuit means 70 appears as a short circuit to ground to radio frequency signals and as a matched resistive load at the biasing signal frequency.

The load circuit means 70 includes a third filter means 72 which passes radio frequency signals and blocks the passage of signals at the bias frequency. The third filter means is connected between the second isolation switch means 32' and ground. In this manner, radio frequency signals are conveyed directly to ground in the transmit mode. In the preferred embodiment, the third filter means includes inductors 74, 76 and a capacitor 78 selected and arranged to be series resonant at the radio frequency signal and parallel resonant at the bias signal frequency. A fourth filter means 80 appears as an open circuit to radio frequency signals and a short circuit to bias signal frequency. The second filter includes an inductor 82 and capacitors 84, 86 of the appropriate size and configuration to appear as a parallel resonant network at the signal frequency and a series resonant network at the bias frequency, i.e. as an open circuit to the radio frequency signals and a short circuit to the bias signals. A resistive load 88, such as a 50 ohm load, is interconnected between the fourth filter means 80 and ground. In this manner, the load 88 is applied across the transmitter at the bias frequency during the transmit portion of each cycle to minimize the effect of the presence of the bias signal on the dynamic range of the power amplifier.

The invention has been described with reference to the preferred embodiments. Obviously, modifications and alterations will be apparent to those of ordinary skill in the art upon reading and understanding the preceding detailed description of the preferred embodiments. It is intended that the invention be construed as including all such alterations and modifications in so far as they come within the scope of the appended claims or the equivalents thereof.

Having thus described the preferred embodiment, the invention is now claimed to be:

1. A magnetic resonance imaging apparatus for reconstructing man-readable images of an internal region of a sample, the apparatus comprising:
    a magnetic field means for selectively establishing a magnetic field and magnetic field gradients thereacross in an imaging region;
    a radio frequency transmitter for supplying an AC bias signal during a transmit portion of each of a plurality of transmit/receive cycles, for selectively supplying radio frequency signals during the transmit cycle portion, and for supplying neither radio frequency nor bias signals during a receive cycle portion, the radio frequency and bias signals being at different frequencies;
    a first isolation means for selectively passing and blocking the passage of at least radio frequency signals from the transmitter means to a probe, the first isolation means being responsive thereto and for blocking the passage of radio frequency signals in the absence thereof;
    a first filter means for selectively passing the RF signals and blocking the bias signal, the first filter means being operativaly connected with the first isolation means at a junction and with the isolation probe;
    a second isolation means for selectively passing and blocking the passage of at least radio frequency signals therethrough, the second isolation means being operatively connected between the junction and a receiver, the second isolation means passing radio frequency signals from the antenna port to the receiver and blocking the passage of radio frequency signals from the RF transmitter means to the receiver; and,
    an image reconstruction means operatively connected with the receiver for reconstructing an electronic representation of an image of an interior region of a sample in the imaging region.

2. The apparatus as set forth in claim 1 further including a second filter means operatively connected between the receiver and the junction for blocking biasing signals from passing to the receiver.

3. The apparatus as set forth in claim 2 further including a third isolation means operatively connected between the second filter means and the receiver for improving isolation of the receiver.

4. The apparatus as set forth in claim 1 wherein the second isolation means includes a switch means which forms an effective short circuit at high power levels of the RF signal and an effective open circuit at low power levels, the switch means being operatively connected with the junction by a quarter wave length at the RF signal frequency cable and with ground.

5. The apparatus as set forth in claim 4 wherein the first and second isolation means each include a pair of crossed PIN diodes which are configured to be biased into a conductive state by the bias signal.

6. The apparatus as set forth in claim 4 further including a load operatively connected between the switch means and ground.

7. The apparatus as set forth in claim 6 further including a series resonant at the RF signal frequency circuit operatively connected between the switch means and ground and a series resonant at the bias signal frequency circuit operatively connected between the switch means and the load.

8. A radio frequency switching and transmission circuit comprising:
   an RF source means for supplying an AC bias signal and selectively supplying an RF signal during a transmit cycle portion, the RF and bias signals having different frequencies;
   a first isolation means which is based conductive by the bias signal, the first isolation means being operatively connected with the RF source means such that RF and bias signals are transmitted therethrough in the transmit cycle portion and such that RF signals are blocked from passing therethrough during a receive cycle portion;
   a first filter means for passing the RF signal and blocking the bias signal, the first filter means being operatively connected between the first isolation means and antenna port such that (i) during the transmit cycle portion, the bias signals are blocked from reaching the antenna port and the RF signals are passed to the antenna port and (ii) during the receive cycle portion, RF signals from the antenna port can pass through the first filter means but are blocked by the isolation means from reaching the RF source; and,
   a receiver port operatively connected with the first filter means for receiving RF signals from the antenna port.

9. The circuit as set forth in claim 8 further including a magnetic resonance probe operatively connected with the antenna port and a radio frequency receiver and image reconstruction means operatively connected with the receiver port for reconstructing an image representation from the received radio frequency signals.

10. The circuit as set forth in claim 8 further including a second filter means operatively connected between the receiver port and the first isolation means for blocking the biasing signal from passing to the receiver port.

11. The circuit as set forth in claim 8 further including a second isolation means for isolating the receiver port at least from the RF source means during the transmit cycle portion and for operatively connecting the receiver port with the antenna port during the receive cycle portion.

12. The circuit as set forth in claim 11 wherein the first and second isolation means each include a pair of crossed PIN diodes which are configured to be biased into a conductive state by the bias signal to function as a short circuit.

13. The circuit as set forth in claim 11 further including a load circuit operatively connected between the second isolation means and ground for applying a preselected load across the radio frequency source means during the transmit cycle portion.

14. The circuit as set forth in claim 11 wherein the second isolation means includes a switching means which forms an effective open circuit in response to the AC bias signal and an effective short circuit during the receive cycle portion such that the effective open circuit is formed during the transmit cycle portion and the effective closed circuit is formed during the receive cycle portion.

15. The circuit as set forth in claim 14 further including a second filter means operatively connected in series between the second isolation means and the receiver port for selectively passing radio frequency signals and blocking the passage of bias signals.

16. The circuit as set forth in claim 15 further including a third isolation means operatively connected in series with the second filter means and the receiver port for improving isolation of the receiver port during the transmit cycle portion and operating as an effective short circuit during the receive cycle portion to connect the receiver port with the antenna port.

17. A radio frequency switching and transmission circuit comprising:
   a RF source for supplying both an RF signal and a dedicated AC bias signal, the RF sourse supplying at least the AC bias signal throughout a transmit portion of each of a plurality of transmit/receive cycles and selectively supplying the RF signal during selected parts of the transmit cycle portion;
   an antenna port operatively connected with the RF source for receiving RF signals therefrom during the transmit cycle portions, the antenna port being operatively connected with a receiver for supplying RF signals thereto during a receive portion of each cycle; and,
   an isolation means operatively connected with the receiver, which isolation means is biased by the AC bias signal to block the passage of RF signals to the receiver and which is biased by an absence of the AC bias signal to enable RF signals to be passed to the receiver, whereby the isolation means prevents the receiver from receiving RF signals directly from the RF source.

18. The circuit as set forth in claim 17 further including a filter means operatively connected with the receiver for preventing the passage of the AC bias signal to the receiver.

19. The circuit as set forth in claim 17 wherein the isolation means includes a switching means which is biased conductive by the AC bias signal, the switching means being operatively connected with ground to pass RF signals from the RF source to ground rather than to the receiver.

20. A radio frequency switching and transmission circuit comprising:
   a RF source for supplying an AC bias signal during a transmit portion of each of a plurality of transmit/receive cycles, the RF source selectively supplies a RF signal during the transmit cycle portion;
   an antenna port operatively connected with the RF source for receiving RF signals therefrom during the transmit cycle portions, the antenna port being operatively connected with a receiver for supplying RF signals thereto during a receive portion of each cycle;
   a switching means operatively connected with the receiver and a ground, which switching means is biased conductive by the AC signal to pass RF signals to ground and which is biased by an absence of the AC bias signal to enable RF signals to be passed to the receiver; and
   a load operatively connected between the switching means and ground.

21. The circuit as set forth in claim 20 further including a radio frequency filter operatively connected between the switching means and the load for passing bias signals and blocking radio frequency signals and a bias signal filter operatively connected between the switching means and ground, such that the load is applied across the radio frequency source means at the bias signal frequency during the transmit cycle portion.

22. The circuit as set forth in claim 21 wherein the switching means includes a pair of crossed PIN diodes that are biased conductive by the bias signal.

23. A radio frequency switching and transmission circuit comprising:
    a transmitter port which is adapted to be connected with a signal source means that selectively supplies RF signals and AC bias signals;
    a first isolation means which is biased by the AC bias signal to conduct at least RF signals from the transmit port to a first junction;
    a first filter means for passing RF signals and for blocking the AC bias signals disposed between the first junction and an antenna port;
    a second isolation means which is biased to block the passage of RF signals therethrough by the AC bias signals, the second isolation means being operatively connected between the junction and a receiver port.

24. The circuit as set forth in claim 23 further including a second filter means for passing the RF signals and blocking the AC bias signals disposed between the second isolation means and the receiver port.

25. The circuit as set forth in claim 24 further including a third isolation means which is selectively biased to block the passage of RF signals, the third isolation means being operatively connected between the second filter means and the receiver port.

26. The circuit as set forth in claim 23 wherein the second isolation means includes a switch means that is biased conductive by the bias signal, the switch means being operatively connected with the junction and further including:
    a radio frequency filter means for blocking the radio frequency signals and passing the bias signals, the radio frequency filter means being operatively connected with the switch means;
    a load operatively connected between the radio frequency filter means and ground, whereby the load is applied across the transmitter port at the bias signal frequency in the presence of the bias signal; and,
    a bias signal filter means for blocking the bias signals and passing the radio frequency signals, the bias signal filter means being operatively connected between the switch means and ground such that radio frequency signals are passed to ground rather than to the receiver port.

27. A method of magnetic resonance imaging, the method comprising:
    selectively establishing a magnetic field and magnetic field gradients across an image region;
    during a transmit portion of each of a plurality of transmit/receive cycles supplying an AC biasing signal and selectively supplying a radio frequency signal;
    passing the radio frequency signal to a magnetic resonance probe for exciting magnetic resonance of selected dipoles in the image region and blocking the passage of the AC biasing signals thereto;
    triggering blocking of the radio frequency signals from passing to a radio frequency signal receiver with the AC biasing signals;
    during a receive cycle portion, terminating supplying the AC biasing signal such that radio frequency signals are passed from the probe to the receiver; and,
    reconstructing an image representation from the received radio frequency signals.

* * * * *